United States Patent
Harel et al.

(10) Patent No.: US 9,525,203 B2
(45) Date of Patent: Dec. 20, 2016

(54) CONTROLLING MTD ANTENNA VSWR AND COUPLING FOR SAR CONTROL

(75) Inventors: Haim Harel, New York, NY (US); Phil Chen, Denville, NJ (US); Kenneth Kludt, San Jose, CA (US)

(73) Assignee: Google Inc., Mountain View, CA (US)

(*) Notice: Subject to any disclaimer, the term of this patent is extended or adjusted under 35 U.S.C. 154(b) by 258 days.

(21) Appl. No.: 14/125,174

(22) PCT Filed: Jun. 21, 2012

(86) PCT No.: PCT/US2012/043632
§ 371 (c)(1),
(2), (4) Date: Dec. 10, 2013

(87) PCT Pub. No.: WO2012/177939
PCT Pub. Date: Dec. 27, 2012

(65) Prior Publication Data
US 2014/0125546 A1    May 8, 2014

Related U.S. Application Data

(60) Provisional application No. 61/499,593, filed on Jun. 21, 2011, provisional application No. 61/500,209, filed on Jun. 23, 2011.

(51) Int. Cl.
*H04B 5/00* (2006.01)
*H01Q 1/50* (2006.01)
*H03H 7/40* (2006.01)
*H04B 1/04* (2006.01)
*H04B 1/3827* (2015.01)

(52) U.S. Cl.
CPC .............. *H01Q 1/50* (2013.01); *H03H 7/40* (2013.01); *H04B 1/0458* (2013.01); *H04B 1/3838* (2013.01)

(58) Field of Classification Search
CPC .................................................. H04B 1/3838
USPC .................................................. 455/41.1, 69
See application file for complete search history.

(56) References Cited

U.S. PATENT DOCUMENTS

| 2007/0173301 A1 | 7/2007 | Kang |
| 2009/0047998 A1* | 2/2009 | Alberth, Jr. ........... H04W 52/42 455/562.1 |
| 2011/0059706 A1 | 3/2011 | Harel et al. |

(Continued)

FOREIGN PATENT DOCUMENTS

| CN | 101005522 | 7/2007 |
| JP | 2002-223185 | 8/2002 |

(Continued)

OTHER PUBLICATIONS

Extended Search Report for co-pending European Patent Application No. 12802885.9 mailed Feb. 9 2015.

(Continued)

*Primary Examiner* — Ping Hsieh
(74) *Attorney, Agent, or Firm* — Troutman Sanders LLP; James E. Schutz; Mark Lehi Jones

(57) ABSTRACT

A method and apparatus has been developed to reduce SAR for a mobile device by designing appropriate matching circuits between each antenna and its power amplifier. In the presence of such matching circuits the normal phase adjustments may be carried out to provide a preferred safe SAR level that can be maintained during phase adjustment without sacrificing TRP.

10 Claims, 10 Drawing Sheets

(56) References Cited

U.S. PATENT DOCUMENTS

2011/0254637 A1\* 10/2011 Manssen ................ H03H 7/40
  333/2
2012/0071108 A1\* 3/2012 Yang .................... H04W 52/16
  455/68

FOREIGN PATENT DOCUMENTS

JP   2004-015179   1/2004
WO  2012/116258   8/2012

OTHER PUBLICATIONS

International Search Report and Written Opinion, Korean Intellectual Property Office, Application No. PCT/US2012/043632, Dec. 21, 2012.
First Office Action for co-pending Chinese Patent Application No. 2012800304294 mailed Aug. 26, 2014.

\* cited by examiner

Fig 1—Reflection and Coupling Mechanism

Fig.2--TRP versus Antenna Signal Phase Difference

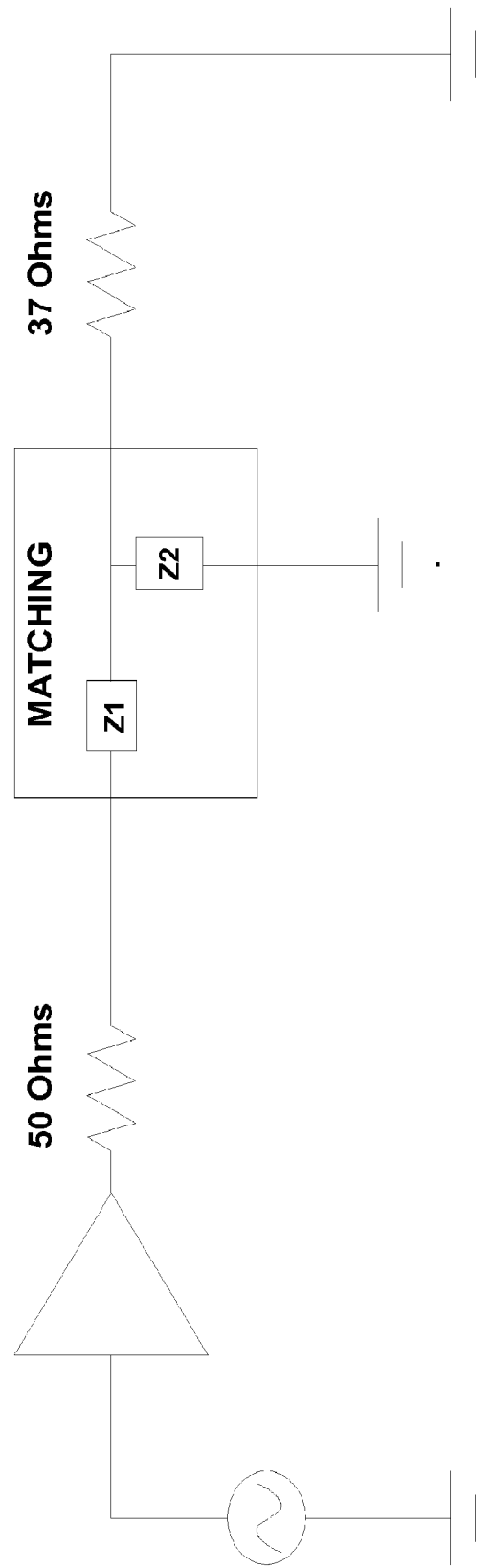
Figure 4—Matching Circuit

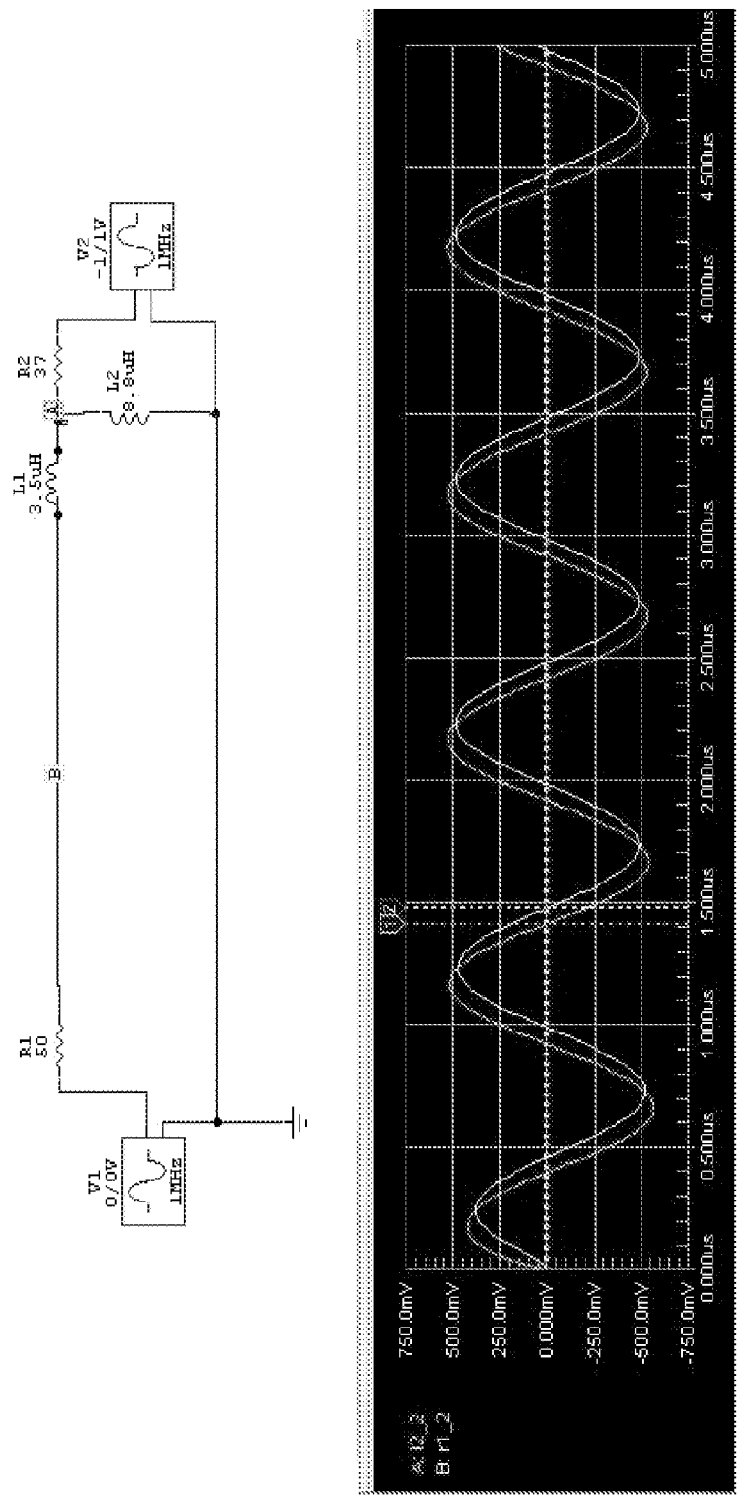
Figure 5—Matching Circuit 1 Simulation

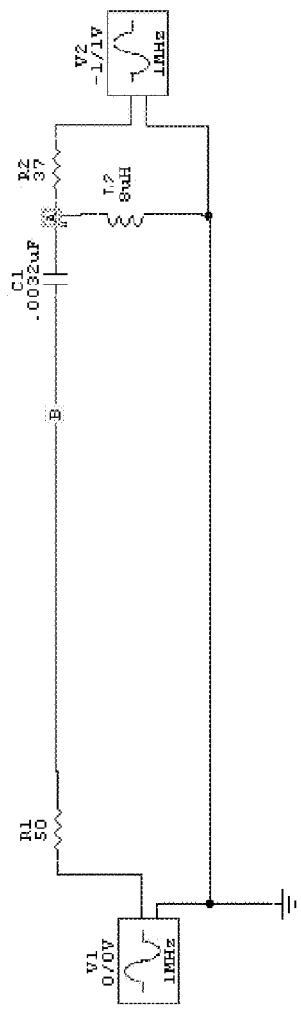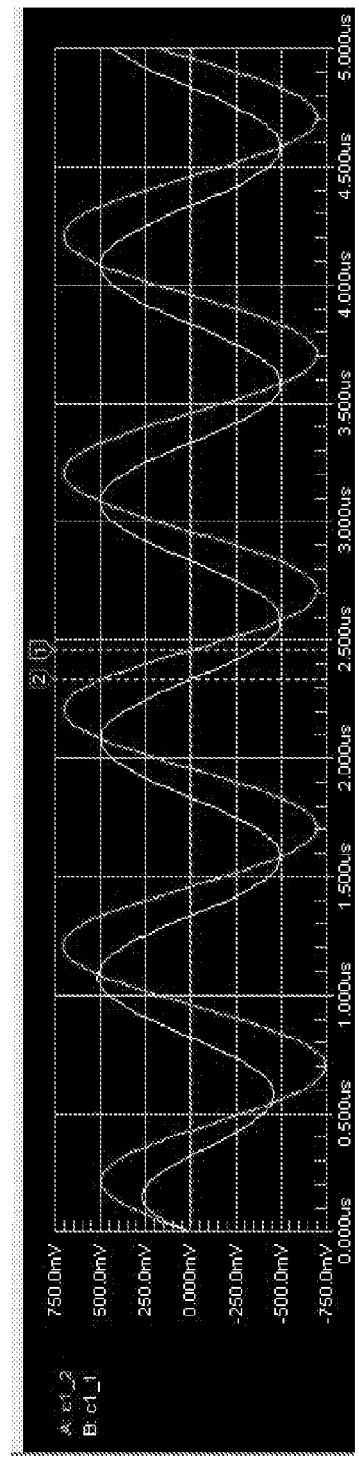
Figure 6—Matching Circuit 2 Simulation

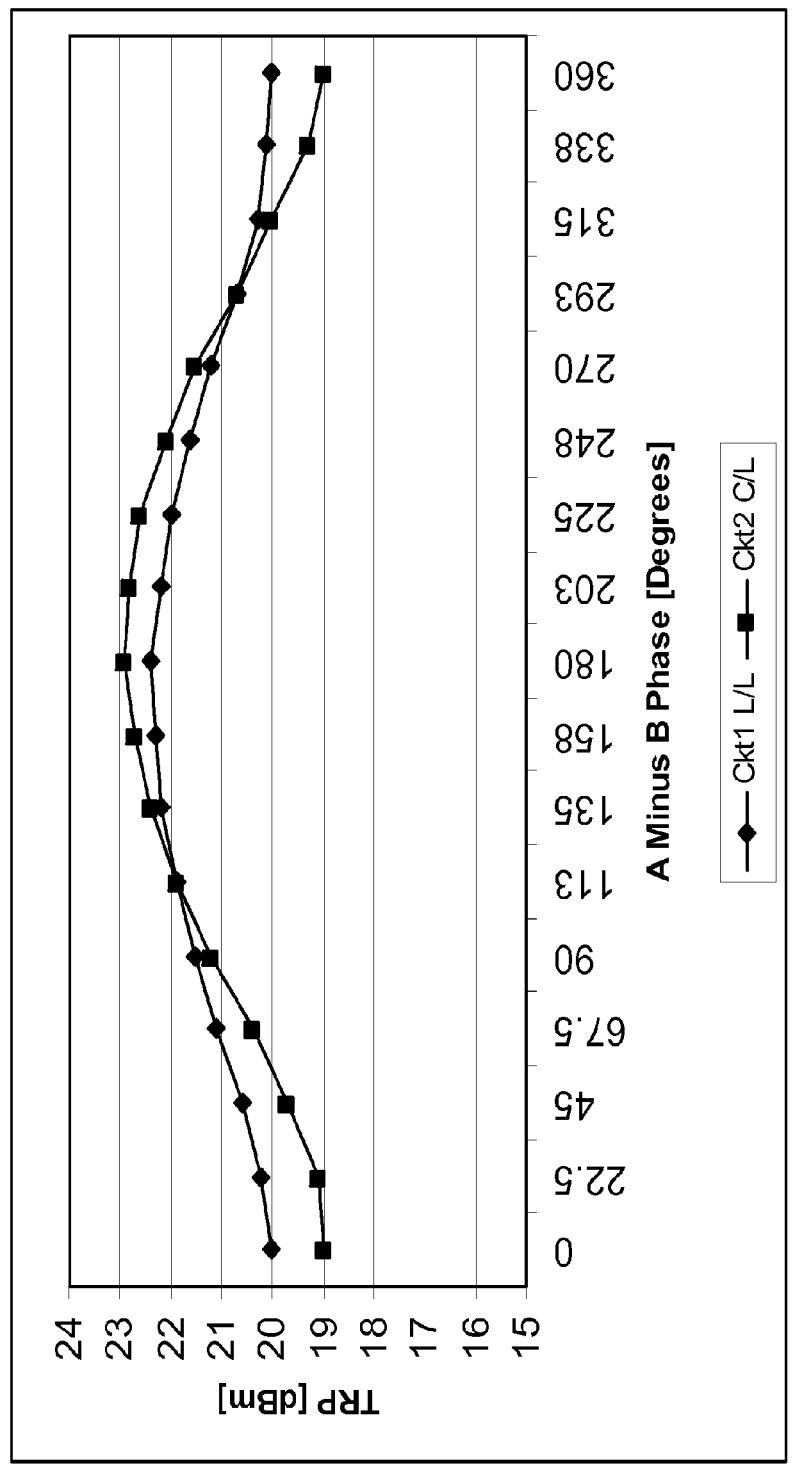
Fig. 7 -- TRP versus A-B Phase Difference

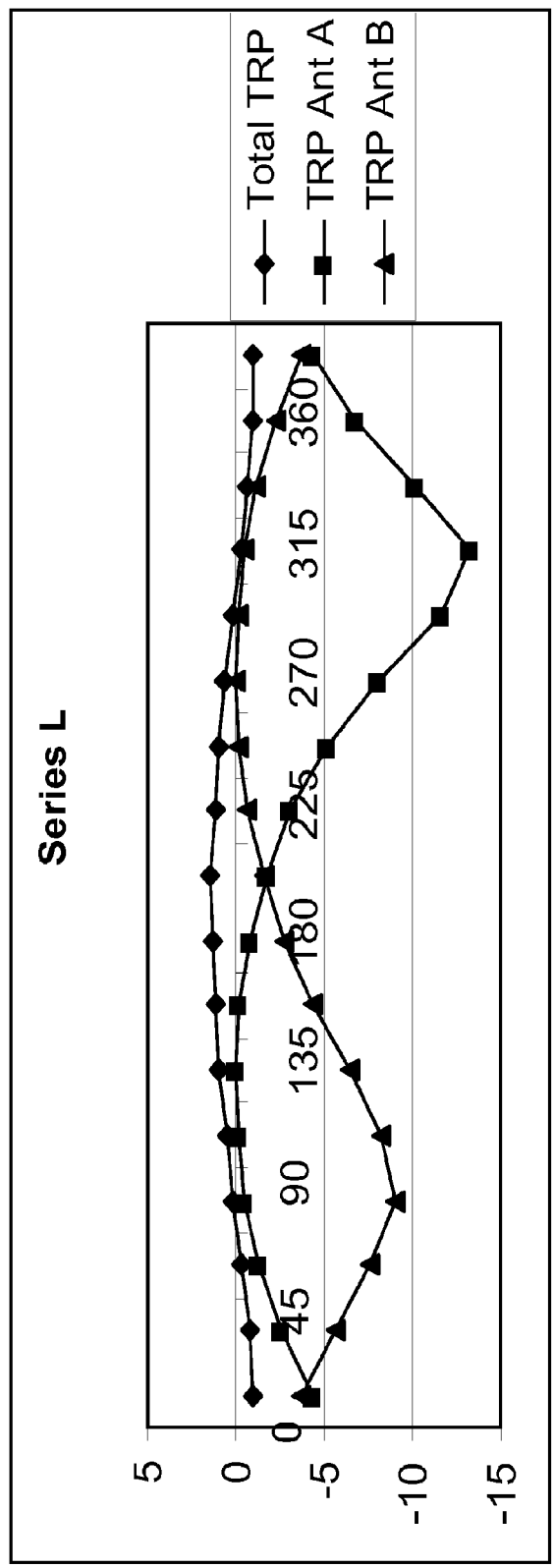
Fig 8—Matching Circuit 1

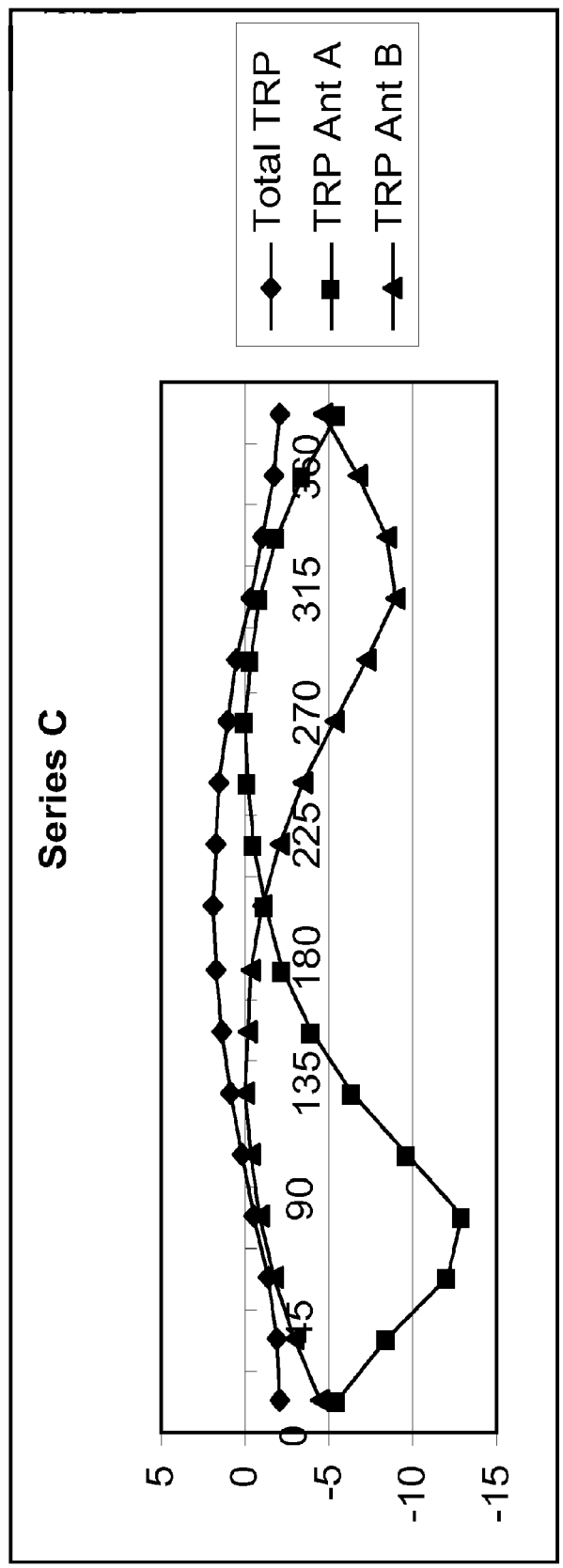
Fig 9—Matching Circuit 2

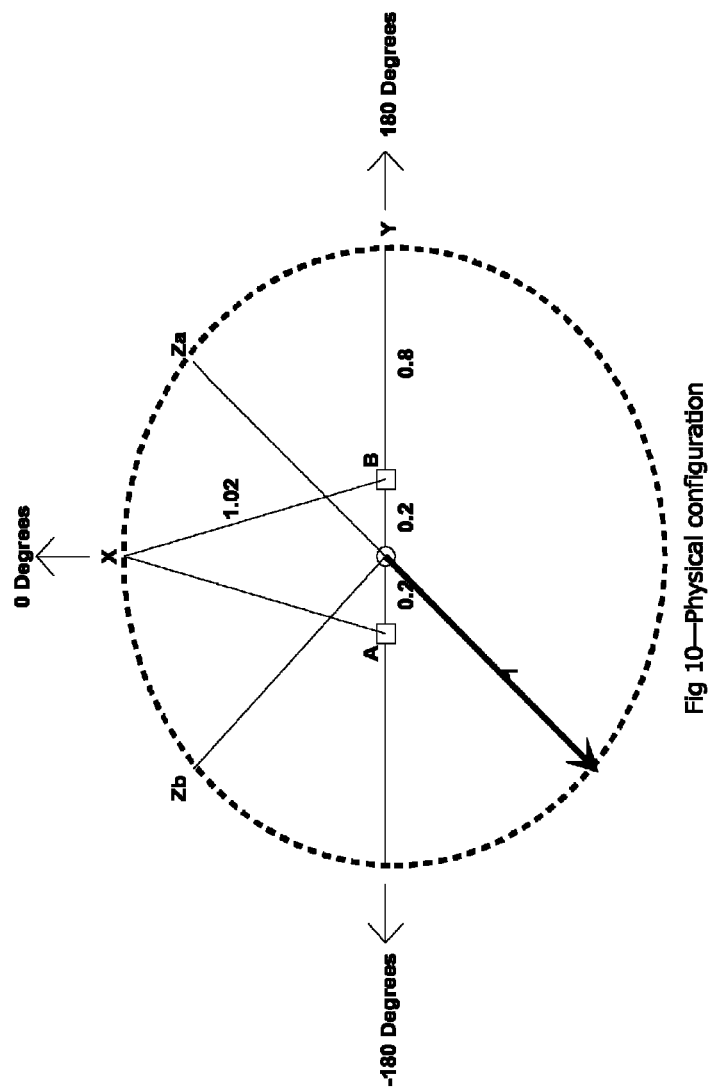

CONTROLLING MTD ANTENNA VSWR AND COUPLING FOR SAR CONTROL

PRIORITY

This application claims priority of U.S. provisional applications 61/499,593, filed Jun. 21, 2011, and 61/500,209, filed Jun. 23, 2011.

FIELD

This disclosure relates to mobile transmission diversity systems having control over Specific Absorption Rate and Total Radiated Power.

BACKGROUND

Signal transmission between a mobile device and a base station is enhanced through mobile transmission diversity (MTD). One form of MTD employs multiple antennas in the mobile unit, each antenna transmitting identical data. The phase difference between the signals from the two or more antennas is controlled so that constructive interference of the signals received at a base station provides power received at the base station greater than the arithmetic sum of the received power that would be radiated from each of the antennas in the absence of the other(s). By varying the phase difference between the signals from the antennas, the peak radiated power may be steered to focus upon the antenna of the base station. Typically two antennas are used for MTD.

Since the phase of a signal reaching a base antenna is affected by changes of path length such as due to reflections, closed loop MTD has been developed where the phase difference at the multiple mobile unit antennas is adjusted in response to feedback from the base station. In particular a quality factor such as bit error rate, or a Power Control Bit (PCB) or Transmitter Power Control (TPC) parameter determined at the base station may be communicated back to the mobile device, or the base station may return a signal indicating whether the received power should be lowered or raised. This communication from the base signals the need to adjust the phase difference between the antenna output.

Since the mobile device is located close to a user, the amount of radiation impinging on the user is also monitored. The Specific Absorption Rate (SAR) is a measure of the amount of power absorbed by biologic tissue and a goal is to keep the SAR below a predetermined value. Absorption levels may be typically defined and measured by placing a liquid-filled phantom head, hand, or other emulated body part close to the edge(s) of a mobile device while transmitting. Measurements of a rise in the liquid's temperature provide an indication of the radiation exposure overall or at particular points To meet SAR requirements the conventional approach may be to set the antenna radiation limits based on peak radiation points rather than peak radiated averages (i.e. total radiated power (TRP)). This conventional approach may cause vendors to limit the maximum power and or the maximum data rate.

BRIEF DESCRIPTION

An apparatus and method has been developed to reduce SAR at near field locations for a mobile device where SAR would otherwise attain its highest value. It relies on what hitherto has been regarded as a problem in mobile diversity systems. In particular, because the antennas in a MTD system are close to each other, the broadcasting antennas receive strong signals from each other. This introduces, by virtue of standing waves resulting from antenna interaction, a complexity in assigning phases to the antenna transmission. In the present disclosure this effect is converted from a detriment into a feature utilized to reduce SAR by providing a method for designing appropriate matching circuits between each antenna and its power amplifier and by providing the device so designed. The normal function of those matching circuits is to reduce VSWR (Voltage Standing Wave Ratio), which is a measure of the impedance mismatch between an antenna and its power amplifier. In the presence of such matching circuits the phase adjustments may be carried out, but instead of using matching circuits wholly to compensate for the phase changes induced by standing waves resulting from antenna interaction, the presence of the standing waves as determined by the matching circuits is used to provide a preferred safe SAR level that can be maintained during phase adjustment.

This disclosure enables a mobile transmit diversity device comprising a plurality of antennas, each antenna receiving a signal from a respective power amplifier mediated by a matching circuit, said matching circuits having a network topology comprising a plurality of impedance components wherein the values of impedance are chosen to produce reflection coefficients and VSWR values that reduce TRP at a phase setting that produces the worst case SAR by the coupled signals among the antennas. That example may produce constant average TRP without exceeding a preset SAR limit or threshold.

DESCRIPTION OF FIGURES

FIG. 4 depicts one example of a matching circuit.

FIG. 5 depicts the phase and amplitude of signals from one simulation of a matching circuit.

FIG. 6 depicts the phase and amplitude of signals from another simulation of a matching circuit.

FIG. 7 depicts the TRP versus phase difference between antennas.

FIG. 8 depicts the TRP of MTD with an inductive matching circuit.

FIG. 9 depicts the TRP of a MTD capacitive matching circuit.

FIG. 10 depicts the physical configuration of a MTD having two antennas A and B.

DETAILED DESCRIPTION

Two issues affect MTD performance: (1) In a situation where there are two antennas termed primary and secondary, there is a "worst" phase in which antennas are set where the signals from each antenna add to create the highest Specific Absorption Rate (SAR). In general, this effect is caused by a near-field addition of the signal fluxes from each antenna at a phase relationship where the signals at the antennas are in phase to that point. (2) The second issue is related to the interaction between antenna Voltage Standing Wave Ratio (VSWR) and the coupling between antennas. As the phase between the two antennas is changed (such as is done in "pointing a beam") there is a change in the Total Radiated Power (TRP). This change in TRP is likely due to the fact that the power coupled from one antenna to another combines with the voltage reflected from that antenna, increasing and decreasing the apparent VSWR seen by the power amplifier (PA). Since this effect is due to the two voltages adding or subtracting, it is dependent on the relative phase of the two signals.

The present disclosure relates to a design methodology such that the electrical phase difference that creates the maximum value of SAR has a somewhat lower TRP, but with such an implementation, the mobile device will operate with higher average TRP without exceeding the SAR limit.
Antenna VSWR-Antenna Coupling.

Figure 1:
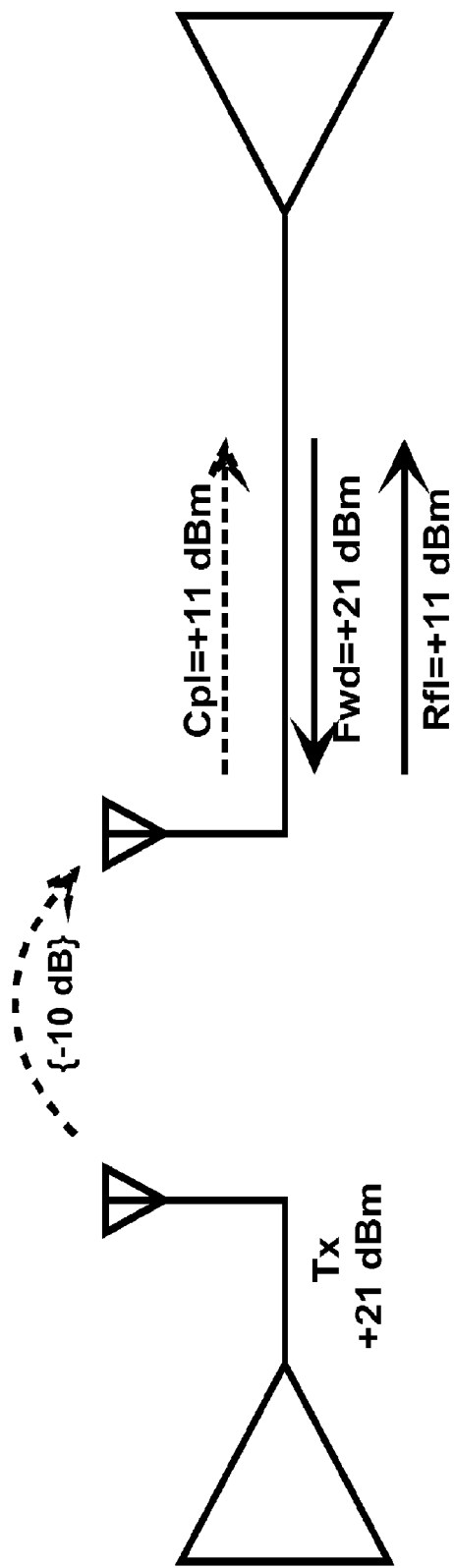
FIG. 1 depicts a reflection and coupling mechanism in a mobile transmission diversity system.

FIG. 1 is a simplified block diagram to explain how the mechanism between antenna coupling and VSWR behaves. It shows an example where two transmitters are operating at +21 dBm each and each sees a 2:1 VSWR that causes a return loss of −10 dB. As a result the reflected power from the antenna is +11 dBm. Also, this example shows a coupling from the transmitter on the left to the transmitter on the right with a 10 dB loss, inducing +11 dBm into the transmitter on the right. In a simple view, the Cpl ("coupling") voltage of the +11 dBm is combined with the reflected voltage Rfl (+11 dBm). Since the voltages could be added or subtracted or something in-between based on their relative phase, the worst "power" reflected is equivalent to +17 dBm (equivalent to a −4 dB return loss) and for the best case, the voltages cancel and there would be zero "power" reflected. For purposes of the example an assumption is that the power radiated by the antenna on the right is equal to the forward power (+21 dBm) minus the power reflected. In the case where the voltages add, only a bit more than half the power is transmitted and when the voltages are cancelled, all of the forward power is radiated. In some respects, this phenomenon appears as a dynamic antenna match tuning circuit as the beam steering phase control algorithm adjusts the phase.

In reality, the same effect is occurring with the transmitter on the left and that means the coupled voltage is not always +11 dBm but sometimes less depending on the coupled signal phase shift versus the angle of the reflection coefficient for that transmitter.

Although this example has been described with particular power levels and particular assumptions to simplify the calculations in the example, it should be understood that the example is representative of a method that is not tied to those particular power levels or to the circuitry under which the example is assumed to function. Persons of skill in this art will know how to adapt this example to different power levels and different specific hardware.

Figure 2:
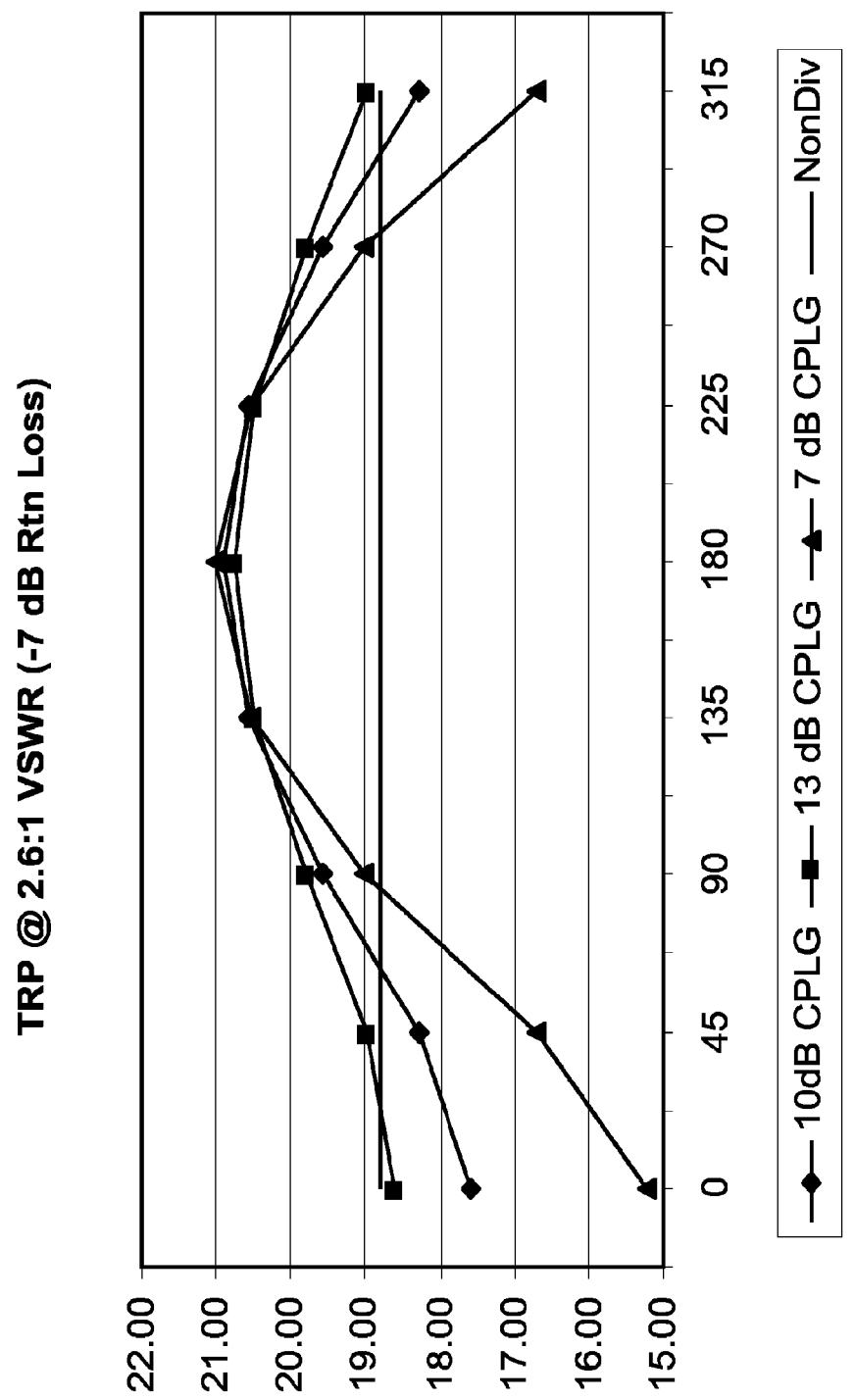
FIG. 2 is a plot of TRP versus antenna signal phase difference

The curves in FIG. 2 show approximately what occurs for one antenna: The curves show how TRP varies for one transmitting leg as the phase is adjusted between the two transmitting antennas. This means that a phase of 0 degrees may be something entirely different than aligning the phase of the radiated signals from each antenna. FIG. 2 shows examples for three levels of coupling (−7 dB, −10 dB and −13 dB) showing the TRP for a −7 dB return loss (~2.5:1 VSWR). A separate horizontal line is the TRP if the one antenna was radiating the total +21 dBm and the other transmitter is turned off. It shows the TRP when the return loss from the VSWR is −7 dB and the coupling is −10 dB. There is about a one dB additional loss. There is a variation of TRP for MTD due to the reflection coefficient of the antenna and the signals being coupled from one antenna to the other antenna. This phenomenon is exploited to provide reduced TRP at beam steering algorithm phase settings that cause highest acceptable SAR.

Figure 3:
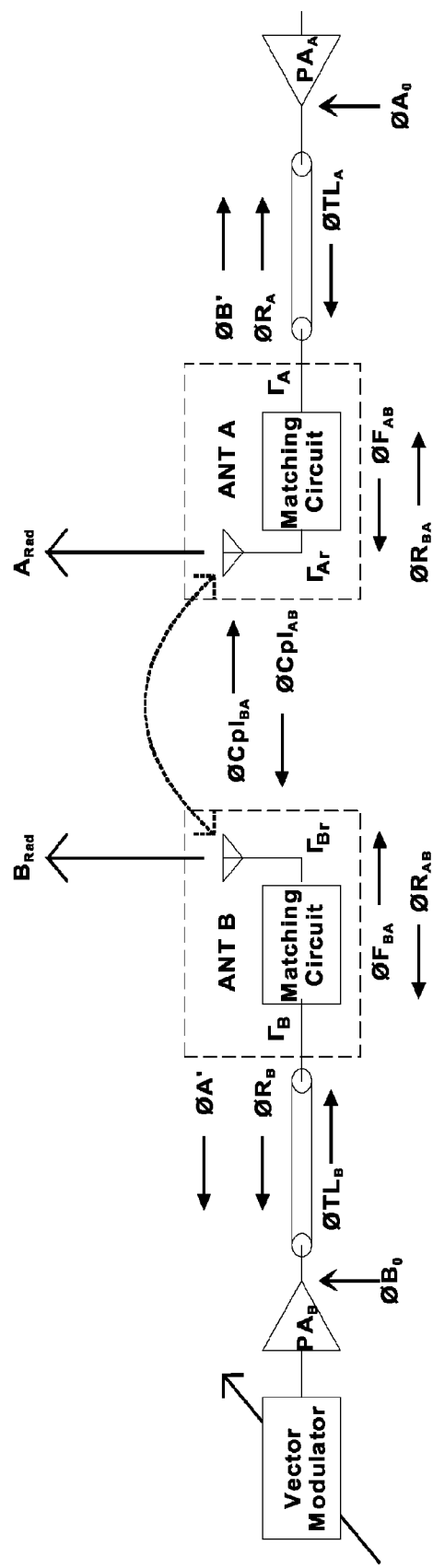
FIG. 3 depicts the placement of matching circuits in a mobile transmission diversity system.

FIG. 3 describes a typical beam forming implementation. In this embodiment the electrical phase of one signal is adjusted, amplified and radiated from one antenna (B). A second signal, essentially coherent with the first is amplified and radiated from a second antenna (A). A beam-steering algorithm adjusts the relative electrical phase of the two signals to produce an enhancement at a desired location (e.g., a base station). This implementation shows that the various components of the circuit affect the signals' characteristics. In this example, we see that for the signal to be radiated from the B antenna, it experiences a phase shift ($\emptyset TL_B + \emptyset F_{BA}$) as it passes through its associated transmission line and its matching circuit and antenna structure. The coupled signal from antenna B to antenna A undergoes another phase shift ($\emptyset Cpl_{BA}$) and one further phase shift ($\emptyset R_{BA}$) introduced by antenna A and its matching circuit. At this point, the resulting signal ($\emptyset B'$) will combine with the signal ($\emptyset R_A$) and depending on their relative phase will increase or reduce the total. When the signals add, the apparent mismatch between the power amplifier $PA_A$ and antenna A will be increased, thus decreasing the radiated power from antenna A. Similarly, when the signal ($\emptyset B'$) adds destructively to the reflected signal ($\emptyset R_A$) the impedance match will be improved and the radiated power from antenna A will be increased. A similar process to that described above applies to the signal from antenna A being coupled to antenna B. This suggests a mechanism to control the transmitted power and thereby SAR when confronted with high antenna VSWR and high antenna coupling by design.

In FIG. 4 an example of a network matching circuit is shown. For the purposes of this example we assume a power amplifier which is matched to 50 Ohms resistive impedance and a quarter wave ground plane antenna with typical input impedance of 37 Ohms.

Two different matching circuits were chosen with the following results:

VSWR to PA approximately 3:1 to match a 6 dB coupling between antennas

L-network topologies as shown in the diagram and two configurations as shown in the chart below and with components chosen for operation at 1 MHz. The calculations show the predicted reflection coefficients for forward (seen by the PA) and reverse (seen by the antenna). We calculate the reflection coefficients Γ and VSWR's as:

$$\text{Fwd: } \Gamma = (Zs - Zload)/(Zs + Zload), VSWR = \frac{1+|\Gamma|}{1-|\Gamma|}$$

$$Zload = Z1 + Z2 \| Zld$$

where Zs is source impedance of the PA, 50 Ohms

Zld is the input impedance of the antenna, 37 Ohms $$\text{Rev: } \Gamma = (Zld - Zload)/(Zld + Zload), VSWR = \frac{1+|\Gamma|}{1-|\Gamma|}$$

$$Zload = Z2 \| Z1 + Zs$$

where Zs is source impedance of the PA, 50 Ohms

Zld is the input impedance of the antenna, 37 Ohms

TABLE 1

Matching Circuit Examples

| # | VSWR | Γ | Θdeg | Z1 Ohm | Z2 Ohm | Z1 = L/C | Z2 = L/C |
|---|------|---|------|--------|--------|----------|----------|
| 1 | Fwd = 3.229:1 | .53 | +94.6 | j22 | j55 | L = 3.5 uH | L = 8.8 uH |
|   | Rev = 3.236:1 | .53 | +98.3 | | | | |
| 2 | Fwd = 3.201:1 | .524 | −105 | −j50 | j50 | C = 3.2 nF | L = 8.0 uH |
|   | Rev = 2.875:1 | .484 | +46.2 | | | | |

The term matching circuit in this context refers to a circuit interposed between a power amplifier and an antenna to which it feeds. It does not necessarily imply a circuit designed to reduce to a minimum the impedance mismatch between the power amplifier and its antenna. Although L-network topologies have been proposed for this example, it will be apparent to persons of skill in the art that other matching circuit configurations may be employed to achieve similar or equivalent results.

FIG. 5 and FIG. 6 depict the simulations with the values from Table 1 and show how the phase of the coupled signal from one antenna is shifted as it passes through the matching network of the other antenna towards the other power amplifier. We can see that the case #1 provides approximately 60 nSec delay as the signal travels through the matching circuit in the reverse direction (22 degrees of lag) and case #2 shows about −127 nSec delay or about 45 degrees leading. If we only consider the match seen by the PA and assume both the A-antenna and the B-antenna are radiating with the same phase (to point a beam directly forward) then the difference between reflected signal and coupled signal is 94.6 degrees−22 degrees=72.6 degrees for case #1 and −105+45 degrees=−60 degrees for case #2. This shows that in order to produce worst case match to the PA, a vector modulator setting would need to be −72.6 degrees in case #1 and +60 degrees with the matching circuit #2. The example showed that two different matching networks, each producing approximately 3:1 VSWR produced a higher and lower apparent VSWR at different A-B (vector modulator) phase settings.

Again, although this example has been described with particular parameter values, it should be understood that the example is representative of a method that is not tied to those particular values or to the circuitry under which the example is assumed to function. Persons of skill in this art will know how to adapt this example to different parameter values and different specific hardware.

As can be seen in FIG. 7, the amount of variation of TRP is different for each of the two circuits in spite of the fact that the degree of match between the power amplifier and antenna is the same. Also, the relative phase setting at which the maximum and minimum occur is slightly different for each of the two circuits. For these curves, the coupling plus the matching circuit loss in the reverse direction was made equal. That is, the coupling between the antennas was adjusted to compensate for the fact that circuit #2 had an additional insertion loss for signals travelling in the reverse direction—toward the PA. We make use of the results to select the matching circuit that best reduces the TRP at the phase setting that produces the worst case SAR (typically 180 degrees phase difference between A and B) and with the least compromise at the other directions (phase differences).

FIG. 8 and FIG. 9 show how the radiated power from each antenna and the total TRP varies as the electrical phase is shifted. It shows that when the power from one antenna is peaked the other is reduced. Important to consider is that the phase setting that creates the power increase is at +/−180 degrees. This phase is the one that produces a beam along the axis between the two antennas.

We expect this phase would normally also produce the highest SAR because that is the location of points where the field is maximized from one of the antennas because that is closest to that antenna. However, for antenna separations less than ½ wavelength, this phase will not be used in a beam pointing algorithm. We can use FIG. 10 to select the matching circuit that minimizes a worst case SAR. Assuming the worst case SAR is at point Za on the physical drawing of FIG. 10, it is obvious by inspection that the first implantation circuit shown in FIG. 8 using the series inductor would be the best choice because it shows the signal radiated by antenna B is reduced for phase relationships (A-B) that are between 0 and 180 degrees. Note that antenna B is closer to point Za. It is obvious that this choice will lower the SAR for beam pointing phases between −180 and 0 degrees because antenna A TRP will be reduced and for these directions antenna A has a shorter distance. On the contrary by choosing matching circuit 2 as shown in FIG. 9, the SAR would be increased for both points Za and Zb.

While certain features of the invention have been illustrated and described herein, many modification, substitutions, changes, and equivalents will now occur to those of ordinary skill in the art. It is, therefore to be understood that the appended claims are intended to cover all such modifications and changes as fall within the true spirit of the invention.

What is claimed is:

1. A mobile transmit diversity device comprising:
a first power amplifier;
a first matching circuit configured to receive and mediate at least a phase of the first signal from the first power amplifier;
a first antenna configured to receive and radiate the first signal mediated by the first matching circuit;
a second power amplifier;
a second matching circuit configured to receive and mediate at least a phase of the second signal from the second power amplifier;
a second antenna configured to receive and radiate the second signal mediated by the second matching circuit;
wherein the first and second antennae are configured to be within each other's near field such that the radiated signals from each of the first and second antennae are coupled by near-field wireless coupling; and
wherein each of the first and second matching circuits include a network topology comprising a plurality of impedance components, wherein impedance values of the impedance components are chosen, based on the coupled signals, to produce reflection coefficients and VSWR values that reduce TRP at a phase setting that produces a worst case SAR by the coupled signals among the antennae.

2. The mobile transmit diversity device of claim 1, where the network topology is an L topology and the impedance components include one or more of inductive and capacitive components.

3. A mobile transmit diversity device being subject to a SAR limit comprising:
   a first power amplifier;
   a first matching circuit configured to receive and mediate at least a phase of the first signal from the first power amplifier;
   a first antenna configured to receive and radiate the first signal mediated by the first matching circuit;
   a second power amplifier;
   a second matching circuit configured to receive and mediate at least a phase of the second signal from the second power amplifier;
   a second antenna configured to receive and radiate the second signal mediated by the second matching circuit;
   wherein the first and second antennae are configured to be within each other's near field such that the radiated signals from each of the first and second antennae are coupled by near-field wireless coupling; and
   wherein each of the first and second matching circuits include a network topology comprising a plurality of impedance components, wherein impedance values of the impedance components are chosen, based on the coupled signals, to produce reflection coefficients and VSWR values that produces constant average TRP without exceeding a predefined SAR limit.

4. The mobile transmit diversity device of claim 3 where the network topology is an L topology and the impedance components include one or more of inductive and capacitive components.

5. A mobile transmit diversity unit being subject to a SAR limit comprising:
   a first power amplifier;
   a first matching circuit configured to receive and mediate at least a phase of the first signal from the first power amplifier;
   a first antenna configured to receive and radiate the first signal mediated by the first matching circuit;
   a second power amplifier;
   a second matching circuit configured to receive and mediate at least a phase of the second signal from the second power amplifier;
   a second antenna configured to receive and radiate the second signal mediated by the second matching circuit;
   wherein the first and second antennae are configured to be within each other's near field such that the radiated signals from each of the first and second antennae are coupled by near-field wireless coupling; and
   wherein each of the first and second matching circuits include a network topology chosen, based on the coupled signals, to produce high antenna coupling as measured by VSWR values and that produces higher average TRP without exceeding a predefined SAR limit.

6. The mobile transmit diversity unit of claim 5, wherein the network topology is an L topology and the impedance components include one or more of inductive and capacitive components.

7. A mobile transmit diversity unit comprising:
   a first power amplifier;
   a first matching circuit configured to receive and mediate at least a phase of the first signal from the first power amplifier;
   a first antenna configured to receive and radiate the first signal mediated by the first matching circuit;
   a second power amplifier;
   a second matching circuit configured to receive and mediate at least a phase of the second signal from the second power amplifier;
   a second antenna configured to receive and radiate the second signal mediated by the second matching circuit;
   wherein the first and second antennae are configured to be within each other's near field such that the radiated signals from each of the first and second antennae are coupled by near-field wireless coupling; and
   wherein impedance values of each of the first and second matching circuits are configured, based on the coupled signals, to minimize a worst case SAR value.

8. The mobile transmit diversity unit of claim 7, wherein the network topology is an L topology and the impedance components include one or more of inductive and capacitive components.

9. A method for selecting matching circuits in a mobile transmit diversity device comprising:
   receiving and radiating, by a first and second antenna configured to be within each other's near field, corresponding first and second radiated signals to produce a radiation field in which the first and second radiated signals are coupled by near-field wireless coupling;
   determining a point at which a SAR associated with the radiation field achieves its highest value:
   responsive to determining that the highest value exceeds a preset SAR threshold:
      sending an interference maximum of a radiation pattern to the point by selecting a phase difference, based on the coupled signals, between the antennae; and
      adjusting the matching circuits to reduce TRP so that SAR is below a preset SAR threshold.

10. The method of claim 9, wherein impedance values of components associated with the matching circuits are adjusted based on the selected phase difference.

* * * * *